United States Patent
Khouri et al.

(10) Patent No.: US 7,035,142 B2
(45) Date of Patent: Apr. 25, 2006

(54) NON VOLATILE MEMORY DEVICE INCLUDING A PREDETERMINED NUMBER OF SECTORS

(75) Inventors: Osama Khouri, Milan (IT); Roberto Ravasio, Carvico (IT); Rino Micheloni, Turate (IT); Giovanni Campardo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 163 days.

(21) Appl. No.: 10/748,696

(22) Filed: Dec. 30, 2003

(65) Prior Publication Data

US 2004/0170057 A1    Sep. 2, 2004

(30) Foreign Application Priority Data

Dec. 30, 2002  (EP) .................................. 02425808

(51) Int. Cl.
*G11C 16/06* (2006.01)
(52) U.S. Cl. ................ 365/185.09; 365/49; 365/185.33
(58) Field of Classification Search ..................... None
See application file for complete search history.

(56) References Cited

U.S. PATENT DOCUMENTS

| | | | | |
|---|---|---|---|---|
| 3,234,521 A | | 2/1966 | Weisbecker ..................... 714/8 |
| 3,633,175 A | | 1/1972 | Harper ..................... 340/172.5 |
| 4,376,300 A | | 3/1983 | Tsang ........................ 365/200 |
| 5,602,987 A | * | 2/1997 | Harari et al. ................... 714/8 |
| 5,838,893 A | * | 11/1998 | Douceur ......................... 714/7 |
| 5,958,065 A | * | 9/1999 | Klein ............................ 714/5 |
| 5,974,564 A | * | 10/1999 | Jeddeloh ........................ 714/8 |
| 6,052,798 A | | 4/2000 | Jeddeloh ........................ 714/8 |
| 6,163,490 A | * | 12/2000 | Shaffer et al. .............. 365/200 |
| 6,426,893 B1 | * | 7/2002 | Conley et al. ......... 365/185.11 |
| 6,484,271 B1 | * | 11/2002 | Gray .............................. 714/6 |
| 6,862,700 B1 | * | 3/2005 | Zhu et al. .................... 714/711 |

FOREIGN PATENT DOCUMENTS

GB    1 491 702    11/1977

OTHER PUBLICATIONS

G. Wood, "Intelligent memory Systems Can Operate Non-stop", Electronic Design, Penton Publishing, Cleveland, OH, USA, vol. 30, No. 6, pp. 243-246, 248, 25, XP-000718043.

\* cited by examiner

*Primary Examiner*—Son Mai
(74) *Attorney, Agent, or Firm*—Lisa K. Jorgenson; Allen, Dyer, Doppelt, Milbrath & Gilchrist, P.A.

(57) ABSTRACT

The device includes a circuit for sector remapping having a CAM (Content Addressable Memory) unit, associated to and in data communication with a multiplexer unit. The CAM unit detects that a sector is defective, it provides the pre-programmed address of a replacing sector and it activates the multiplexer which performs the replacement. The defective sectors and the corresponding locations of the address map are therefore advantageously positioned to the rear to the addressing area. The addressing area is consequently continuous, thus allowing the information to be easily stored and retrieved.

7 Claims, 5 Drawing Sheets

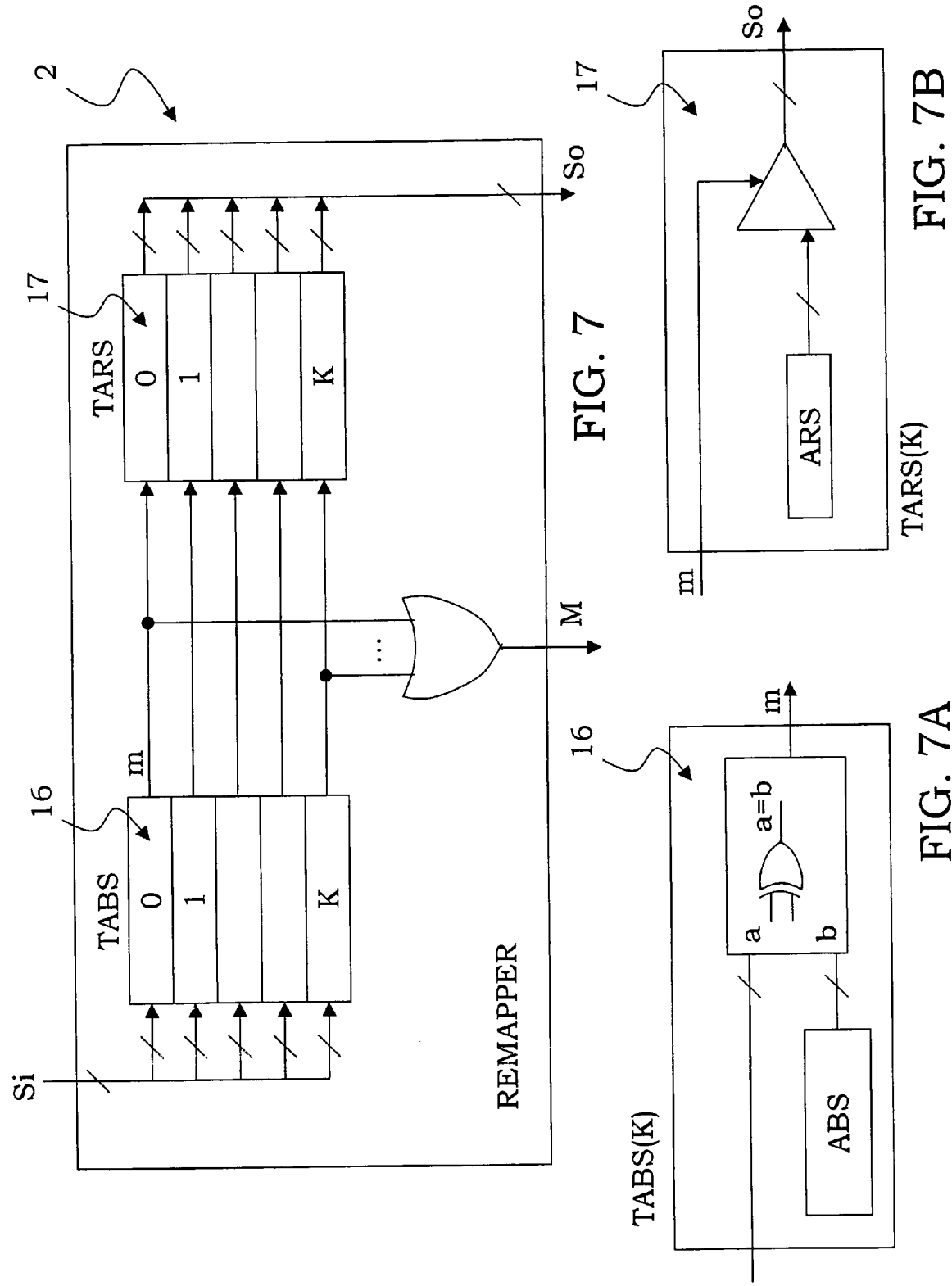

NON VOLATILE MEMORY DEVICE INCLUDING A PREDETERMINED NUMBER OF SECTORS

FIELD OF THE INVENTION

The present invention relates to memories, and more particularly, to a non-volatile memory having a plurality of sectors.

BACKGROUND OF THE INVENTION

As it is well known in this specific technical field, non volatile memories, and particularly electrically programmable and erasable flash memories, comprise cell matrices, each matrix being an information storage unit. It is also known that, to ensure an optimum memory operation, it is necessary that the cells are adjacent to each other, thus ensuring a continuous addressing area.

It is possible that a cell, a set of cells or whole hierarchical cell structures (rows, columns, matrix sectors) may not operate correctly, thus making the whole memory unusable. To overcome this problem the use of redundancy resources has been suggested, i.e. the realization of memories comprising a greater number of cells or cell structures (rows, columns, sectors) than the memory nominal capacity, i.e. than the cells being strictly necessary to ensure a predetermined memory nominal capacity.

It is therefore possible to replace non-operating sectors of the memory matrix with the redundancy resources, allowing memories otherwise considered unusable to be recovered. Although advantageous under many aspects, and substantially corresponding to the scope, this first technical approach has a major drawback described below.

The insertion of redundancy resources leads to the construction of memories with a greater area than the area being strictly necessary, independent of whether they are defective or operating, and this negatively affects production costs.

SUMMARY OF THE INVENTION

An object of the present invention is to provide a non volatile memory having such structural and functional characteristics as to allow the drawbacks mentioned with reference to the prior art to be overcome.

The present invention provides a memory being capable of operating correctly even with defective cells. On the bases of this approach, the technical problem is solved by a memory as previously described, characterized in that it includes a supplementary circuit for sector remapping.

The memory allows the technical problem to be solved and the above-described prior art drawbacks to be overcome. In fact through this memory it is possible to remap operating sectors so as to provide a continuous addressing area.

BRIEF DESCRIPTION OF THE DRAWINGS

The features and advantages of the method according to the invention will be apparent from the following description of an embodiment thereof given by way of non-limiting example with reference to the attached drawings.

FIG. 2 is a schematic diagram showing a sector matrix of the memory of FIG. 1.

FIG. 3 is a table illustrating the address logic map of the addresses of matrix of FIG. 2.

FIG. 7 is a schematic diagram showing an alternative operation of a memory according to the present invention.

FIGS. 7A and 7B are schematic diagrams showing respective details of the memory operation of FIG. 7.

DETAILED DESCRIPTION OF THE PREFERRED EMBODIMENTS

Figure 1:
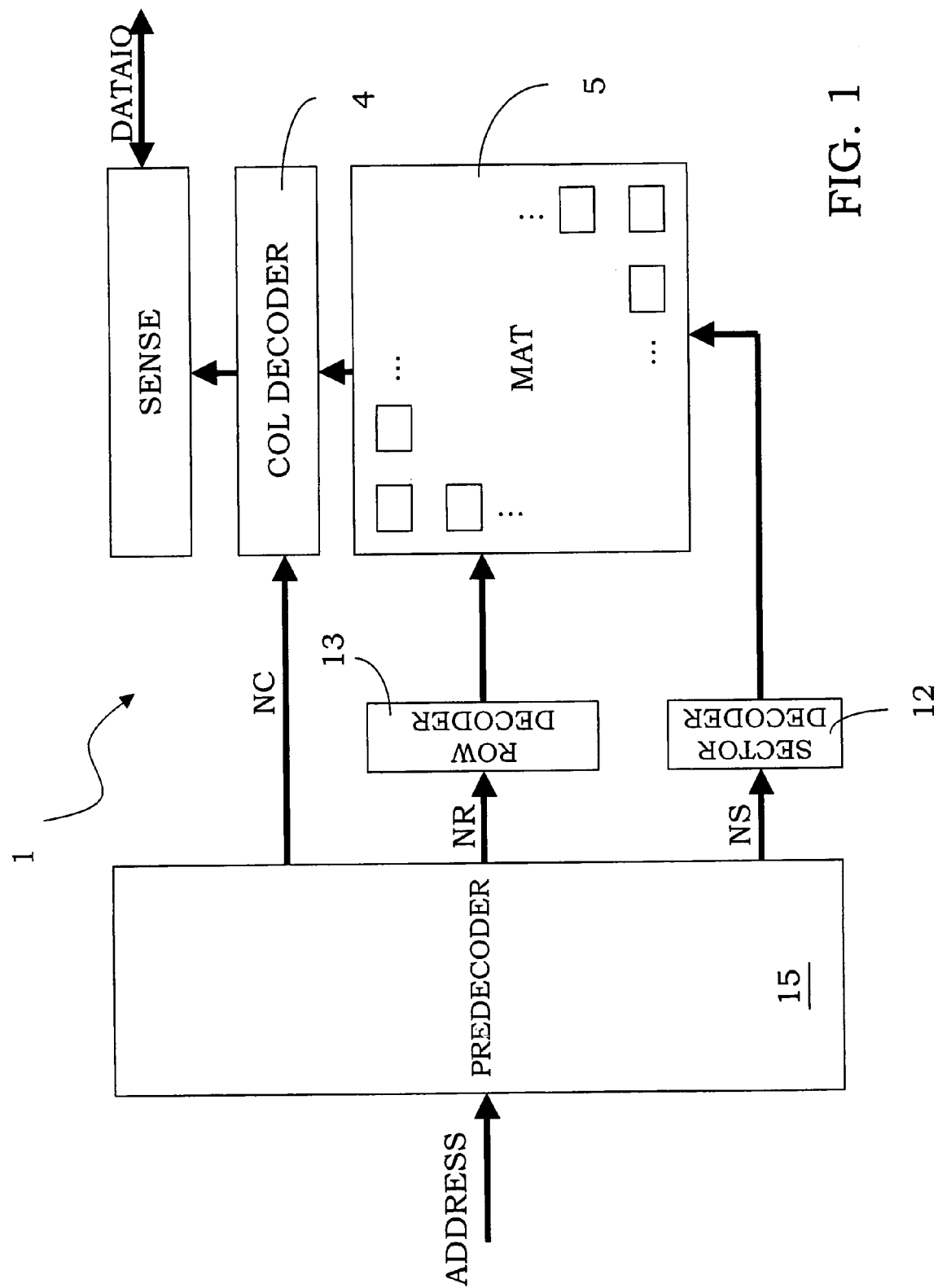
FIG. 1 is a schematic diagram showing a memory according to the present invention.

With reference to the drawings, and particularly to the example of FIG. 1, a non volatile memory electronic device 1 according to the invention will be described below. Memory device 1 may be any monolithic electronic system incorporating a matrix 5 of memory cells organized in rows and columns, as well as circuit portions associated to the cell matrix and responsible for the addressing, decoding, reading, writing and erasing of the memory cell content. Such a device can be for example a semiconductor-integrated memory chip and of the non volatile EEPROM Flash type split in sectors and electrically erasable.

Among the circuit portions associated to the cell matrix, a row decoding circuit portion 13 is provided, which is associated to each sector and supplied with specific positive and negative voltages generated inside the integrated memory circuit. A column decoding 4 and a sector decoder 12 are also provided. An address predecoder 15 is provided in accordance with the present invention upstream of decoders 13, 4 and 12.

Figures 2, 3:
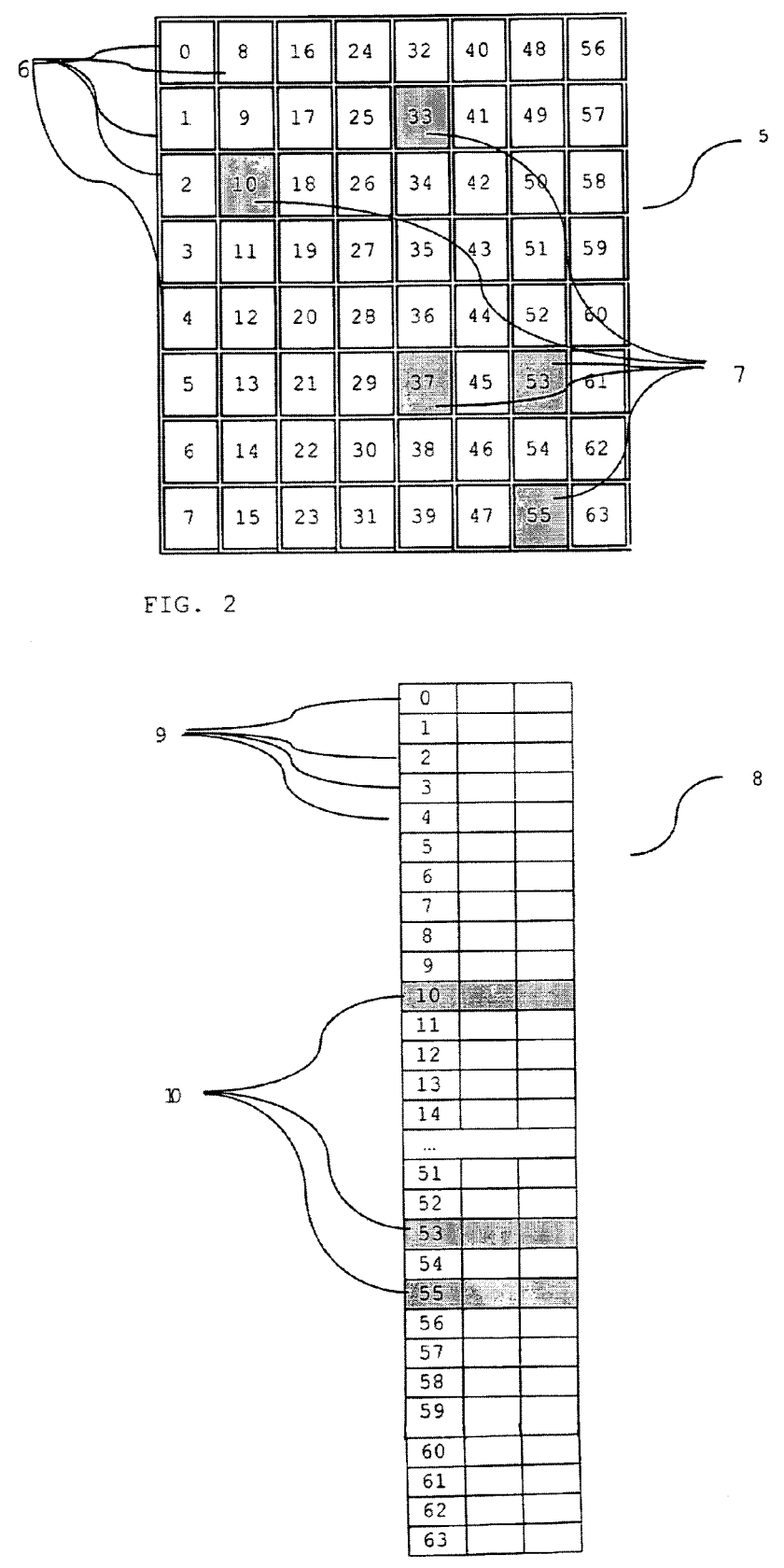

In the embodiment being described, the matrix 5 comprises sixty-four sectors 6, arranged on eight rows and eight columns, of which, by way of non limiting example, five sectors 7, shown in grey in FIG. 2, are defective. An address map 8, shown in FIG. 3, corresponds to the matrix 5 of sectors 6, wherein each location 9 comprises the address of the corresponding sector 6 in matrix 5. In the address map 8, locations 10, corresponding to defective sectors 7, are empty.

Advantageously, device 1 also comprises a circuit 2 for sector remapping, composed of a CAM (Content Addressable Memory) unit, associated to and in data communication with a multiplexer unit 3. The CAM unit 2 is equipped with a predetermined number of elements and it can be a non volatile memory (UPROM) or a volatile memory (RAM, LATCH) which is charged when the device is turned on.

Figure 4:
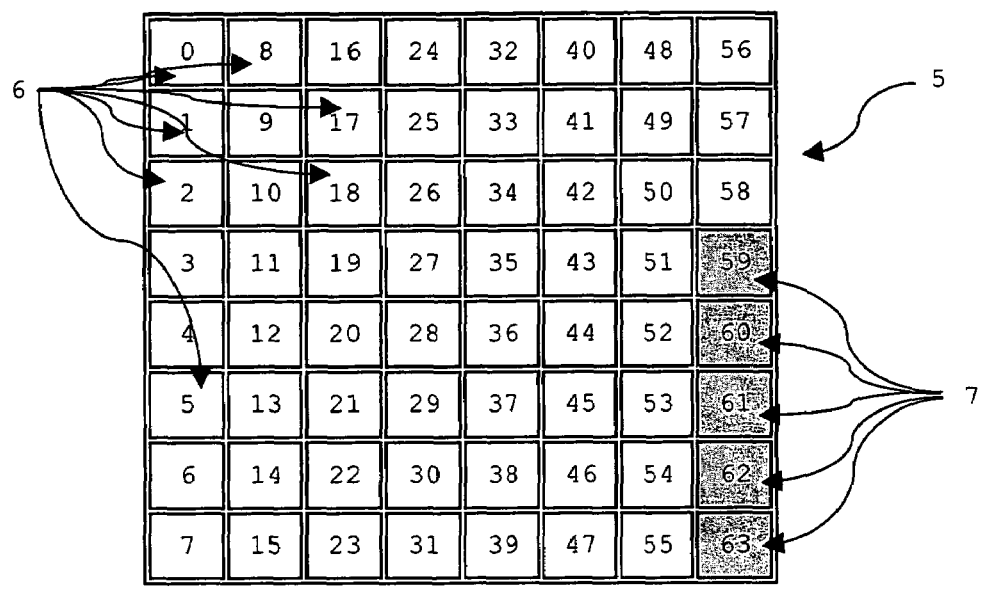
FIG. 4 is a schematic diagram showing a sector matrix of the memory of FIG. 1.
Figure 5:
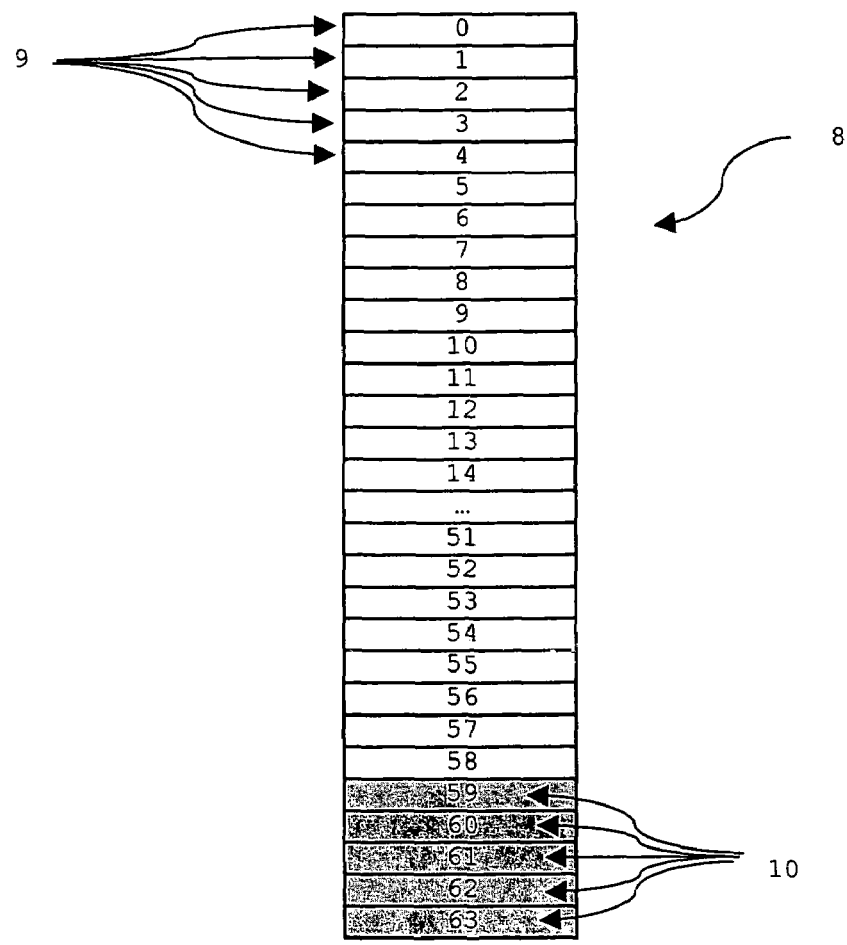
FIG. 5 is the address logic map of the matrix of FIG. 4.

According to a preferred embodiment of the present invention, when the CAM unit 2 detects that a sector 7 is defective, it provides the pre-programmed address of a replacing sector 6 and it activates the multiplexer 3 which performs the replacement. The defective sectors 7 and the corresponding locations 10 of the address map 8 are therefore advantageously positioned to the rear to the addressing area as shown in FIGS. 4 and 5. The addressing area is consequently continuous, thus allowing the information to be easily stored.

Through the memory device 1 according to the present invention it is possible to implement a method to make memories comprising defective sectors operative. Such a method involves the following:

detecting a defective sector 7 in memory 1, storing the address of this defective sector 7, supplying the pre-programmed address of a replacing sector (operating sector 6), and replacing the defective sector 7 with the operating sector 6.

Particularly, the first three steps of the method are performed by the sector remapping circuit 2 (CAM unit), while the replacing step of the defective sector with an operating sector is carried out by the multiplexer unit 3. According to a preferred embodiment of the present invention (FIG. 6), the request of the memory cell content is made to the non volatile memory electronic device 1 by providing the device 1 with the information concerning the desired cell address in the row+column+sector pattern (indicated with r, c, s in FIG. 6).

Figure 6:
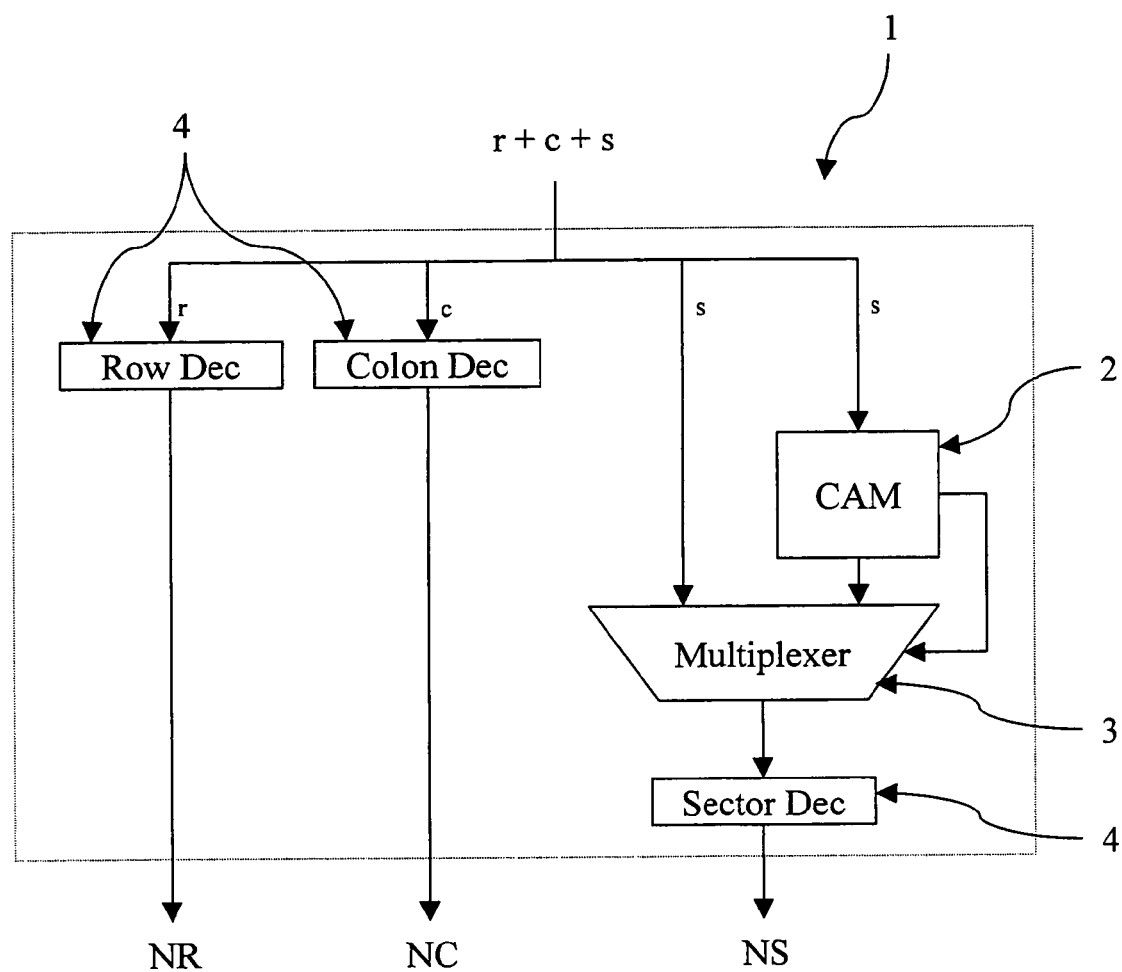
FIG. 6 is a schematic diagram showing the operation of a memory according to the present invention.

The information concerning the row and column are sent to respective circuit portions 4, indicated in FIG. 6 with "Row Dec" and "Colon Dec", which decode the information and provide the corresponding row and column numbers, indicated in FIG. 6 with NR and NC. The information concerning the sector is sent instead both to the CAM memory 2 and to the multiplexer 3. The CAM memory 2 comprises, as mentioned above, the defective sector replacing address. Thus, if the address required corresponds to the address of an operating sector, the CAM memory 2 does not provide the multiplexer with any information and the latter provides the circuit portion 4 referred to as "Sector DEC" with the address of the originally required sector.

On the contrary, if the address required corresponds to the address of a defective sector, the CAM memory 2 provides the multiplexer with the preprogrammed address of a corresponding operating sector and it activates the multiplexer for replacing the address to be sent to the circuit portion 4 referred to as "Sector DEC". The circuit portion 4 referred to as "Sector DEC" decodes the address received at its input and it provides the sector number, indicated in FIG. 6 with NS.

Experimental tests have verified that the memory according to the invention is economically competitive compared to other technical approaches currently used in this field. Particularly, a device of the above-described type allows memories comprising a lower number of defective sectors than a predetermined limit to be used and marketed, allowing the production yield to be improved.

According to an alternative embodiment of the present invention, the matrix 5 comprises a higher number of sectors than the nominal capacity of the memory itself. An increase in the memory available for data storage and program execution is thus advantageously obtained. It is also possible to implement an alternative embodiment of the above-described method comprising the steps of detecting a defective sector in a memory, storing the already-coded sector information and providing the information (FIG. 7).

According to this alternative embodiment, the request of the memory cell content is made to the non volatile electronic device 1 through the pre-decoding block 15 which provides the matrix 5 with the information concerning the desired cell address in the row+column+sector pattern. The information concerning the row and column are sent to respective circuit portions 13 and 4. The information concerning the sector is sent instead both to the CAM memory 2 and to the circuit portion 12.

Memory elements 16 referred to as TABS (Table Address Bad Sectors) which carry the damaged sector information are indicated in the device 2 of FIG. 7. On the contrary, other memory elements 17, referred to as TARS (Table Address Remapping Sectors) store the addresses of the sectors 1 to be used instead of damaged sectors. The logic port OR allows the number M of sectors to be remapped to be obtained while the corresponding addresses So are shown at the device 2 output.

FIGS. 7A and 7B schematically show in an enlarged scale memory elements 16 and 17 which can be formed for example by combining a non volatile cell with a volatile cell. This advantageously allows the reading time of data included in the memory cell matrix 5 to be reduced.

The present invention is open to further changes and modifications within the skilled artisan's knowledge and, as such, falling within the protection field of the invention itself, as defined in the following claims.

That which is claimed is:

1. A non-volatile memory device comprising:
    a memory cell matrix including a plurality of sectors; and
    a remapping circuit for remapping defective sectors of the memory cell matrix, defective sectors comprising sectors having at least one defective cell, the remapping circuit comprising a content addressable memory (CAM) unit for detecting defective sectors of the memory cell matrix and including
        first memory elements containing defective sector addresses, and
        corresponding second memory elements containing replacement sector addresses;
    a multiplexer unit connected downstream from and in data communication with said CAM unit, and associated to and in data communication with the memory cell matrix;
    said CAM unit activating said multiplexer unit to replace defective sector addresses with replacement sector addresses when defective sectors of the memory cell matrix are detected.

2. A non-volatile memory device according to claim 1, wherein said CAM unit comprises a non volatile memory.

3. A non-volatile memory device according to claim 1, wherein said CAM unit comprises a volatile memory which is activated when the memory device is activated.

4. A non-volatile memory device according to claim 1, wherein the plurality of sectors comprises a higher number of sectors than a nominal capacity of the memory device.

5. A method for restoring a non-volatile memory including a memory cell matrix having memory cells divided into a plurality of sectors, the method comprising:
    detecting defective sectors of the memory cell matrix with a content addressable memory (CAM) unit, the defective sectors comprising sectors having at least one defective memory cell;
    storing an address of the defective sector in first memory elements of the CAM unit; and
    providing a pre-programmed replacement sector address in second memory elements of the CAM unit, the replacement sector address corresponding to a replacement sector to replace the defective sector with the replacement sector among the plurality of sectors of the memory cell matrix;
    the CAM unit activating a multiplexer unit in data communication with the memory cell matrix to replace defective sector addresses with replacement sector addresses when defective sectors of the memory cell matrix are detected.

6. A method according to claim 5, wherein the CAM unit comprises a non volatile memory.

7. A method according to claim 6, wherein the CAM unit comprises a volatile memory which is activated when the memory device is activated.

* * * * *